United States Patent [19]
Randall et al.

[11] Patent Number: 5,783,840
[45] Date of Patent: Jul. 21, 1998

US005783840A

[54] UNIVERSAL QUANTUM DOT LOGIC CELL

[75] Inventors: John N. Randall. Richardson; Gary A. Frazier. Garland. both of Tex.

[73] Assignee: Texas Instruments Incorporated. Dallas. Tex.

[21] Appl. No.: 472,108

[22] Filed: Jun. 7, 1995

Related U.S. Application Data

[63] Continuation of Ser. No. 214,084, Mar. 16, 1994, Pat. No. 5,447,873, which is a continuation of Ser. No. 811,557, Dec. 20, 1991, abandoned.

[51] Int. Cl.$^6$ .................................................. H01L 29/06
[52] U.S. Cl. .......................... 257/24; 257/14; 257/25; 257/270
[58] Field of Search ........................ 257/14, 20–25, 257/27, 187, 192, 270; 437/89, 133

[56] References Cited

U.S. PATENT DOCUMENTS

| | | | |
|---|---|---|---|
| 4,575,924 | 3/1986 | Reed et al. | 257/25 |
| 4,758,870 | 7/1988 | Hase et al. | 257/26 |
| 4,983,540 | 1/1991 | Yamaguchi et al. | 437/110 |
| 5,346,851 | 9/1994 | Randall et al. | 437/89 |
| 5,347,140 | 9/1994 | Hirai et al. | 257/20 |
| 5,408,106 | 4/1995 | Seabaugh | 252/17 |
| 5,440,148 | 8/1995 | Nomoto | 257/25 |

FOREIGN PATENT DOCUMENTS

| | | | |
|---|---|---|---|
| 0226383 | 6/1987 | European Pat. Off. | |
| 4-3942 | 1/1992 | Japan | 257/24 |

OTHER PUBLICATIONS

Gary Frazier, Technology and Applications Roadmap for Nanoelectronics. Technology and Applications Roadmap, pp. 219–222 no month.

Broekaert et al., AlAs Etch–Stop Layers for InGaAlAs/InP Heterostructure Devices and Circuits, 1990 IEEE, IEDM 90, pp. 339–342, no month.

Broekaert et al.. Extremely High Current Density. Low Peak Voltage, Pseudomorphic $In_{0.53}Ga_{0.47}As/AlAs/InAs$ Resonant Tunneling Diodes, 1989 IEEE, pp. 559–562 no month.

Broekaert et al.. Pseudomorphic $In_{0.53}Ga_{0.47}As/AlAs/InAs$ Resonant Tunneling Diodes with Peak–to–Valley Current Ratios of 30 at Room Temperature, Appl. Phys. Letter 53(16), 17 Oct. 88, pp. 1545–1547.

Chou et al., Lateral Resonant Tunneling Transistors Employing Field–Induced Quantum Wells and Barriers, Proceedings of the IEEE, vol. 79, No. 8, Aug. 91, pp. 1131–1139.

Huang et al., Analysis of n–Channel MOS–Controlled Thyristors, IEEE Transactions on Electron Devices, vol. 38, No. 7, Jul. 91, pp. 1612–1618.

Ide et al., Sidewall Growth by Atomic Layer Epitaxy, Appl. Phys. Letter 53(23), 5 Dec. 88, pp. 2314–2316.

Seabaugh et al.. Pseudomorphic Bipolar Quantum Resonant–Tunneling Transistor, IEEE Transactions on Electron Devices, vol. 36, No. 10, Oct. 1989, pp. 2327–2334.

Seabaugh et al.. Quantum–Well Resonant–Tunneling Transistors, Twelfth Bienniel Conference on Advanced Concepts in High Speed Semiconductor Devices and Circuits, Aug. 89.

Seabaugh et al.. Room Temperature Hot Electron Transistors with InAs–Notched Resonant–Tunneling–Diode Injector, Japanese Journal of Applied Physics, vol. 30, No. 5, May 91, pp. 921–925.

Yamamato et al., Buried Rectangular GaInAs/InP corrugations of 70 nm Pitch Fabricated by OMVPE, Apr. 90.

Yang et al., New Field–Effect Resonant Tunneling Transistor: Observation of Oscillatory Transconductance, Appl. Phys. Letter 55(26), 25 Dec. 89, pp. 2742–2744.

*Primary Examiner*—Sara W. Crane
*Attorney, Agent, or Firm*—Carlton H. Hoel; W. James Brady; Richard L. Donaldson

[57] ABSTRACT

A quantum dot logic unit (8) is provided which comprises a row of quantum dots (14, 16, and 18), with each quantum dot separated by vertical heterojunction tunneling barriers (20, 22, 24, and 26). Electric potentials placed on inputs (32, 34, and 36) are operable to modulate quantum states within the quantum dots, thus controlling electron tunneling through the tunneling barriers.

1 Claim, 2 Drawing Sheets

ND,840

UNIVERSAL QUANTUM DOT LOGIC CELL

This is a division, of application Ser. No. 08/214,084, filed Mar. 16, 1994, now U.S. Pat. No. 5,447,873 which is a continuation of Ser. No. 07/811,557, filed Dec. 20, 1991, now abandoned.

NOTICE

The U.S. Government has a paid-up license in this invention and the right in limited circumstances to require the patent owner to license others on reasonable terms as provided for by the terms of Contract No. F08630-91-C-0012.

TECHNICAL FIELD OF THE INVENTION

This invention relates generally to electronic devices, and more particularly to an improved quantum effect switching device.

RELATED APPLICATIONS

This application is related to an application entitled "LATERAL RESONANT TUNNELING TRANSISTOR WITH HETEROJUNCTION BARRIERS", Ser. No. 07/787,850, filed Nov. 5, 1991, (attorneys' docket No. TI-16240).

BACKGROUND OF THE INVENTION

The functional density of electronic devices is an important measure of the power and utility of integrated circuits. Significant resources are continually expended in search of ways to downscale minimum device geometries and therefore increase the functional density of electronic devices. The development of nanoelectronics, which makes use of electron quantum effects, has presented an electronics regime that may provide for substantial decreases in device geometries over devices predominantly used in integrated circuits today.

Until very recently, nanoelectronic quantum effect devices have largely been the subject of study and laboratory experimentation. However, advancements in fabrication techniques have increased the viability of such devices in a wide range of applications.

Because of demonstrated switching capabilities of quantum effect devices, the successful application of such devices in digital electronics appears promising. Prior art devices have been able to switch current in quantum effect devices through use of electric fields. For example, Chou, Allee, Pease, and Harris have disclosed such a device in their paper "Lateral Resonant Tunneling Transistors Employing Field-Induced Quantum Wells and Barriers," *Proceedings of the IEEE*, Volume 79, No. 8, August 1991, pp. 1131–1139. As another example, Yang, Kao, and Shih discussed a Stark-Effect Transistor in their paper "New Field Effect Resonant Tunneling Transistor: Observations of Oscillatory Transconductance," *Appl. Phys. Lett.* 55 (26N), 25 Dec. 1989, pp. 2742–2744.

Although advances have been made in the development of quantum effect devices, progress has been slow for applications in digital electronics. For example, devices such as those disclosed by Chou, et al. display certain characteristics of semiconductor switching devices. Through the use of electric fields, quantum wells can be created between depletion-region-potential-barriers, and resonant tunneling can be observed. Thus, electric current can be switched on or off, depending upon the strength of the electric fields. The performance of such devices, however, is highly dependent upon precise dopant concentrations, and they must be operated only at low temperatures. Devices such as those disclosed by Yang, et al. make use of physical, horizontal potential barriers. In such devices, current flow is affected through use of electric fields generated between front and back gates.

None of the prior art devices have provided for the performance of multiple input digital logic functions in a single device. Therefore, a need has arisen for a quantum effect device that allows for a plurality of inputs, such that logical functions may be realized by switching current "ON" and "OFF" by application of predetermined potentials to each of the inputs.

SUMMARY OF THE INVENTION

In accordance with the teachings of the present invention, a quantum effect logic device is provided which comprises a row of quantum dots separated by vertical heterojunction tunneling barriers. The row of quantum dots is coupled to a source and a drain, and gate bodies over the row of quantum dots control electric fields in each of the quantum dots. In operation, potentials placed on the gate bodies can be used to align or misalign the quantum states in each of the quantum dot rows with occupied electron energy states available at the source and unoccupied states in the drain.

According to one specific embodiment of the present invention, a row of quantum dots may comprise different sized quantum dots, such that different electric fields will be required in each quantum dot to align or misalign their energy states with those of available energy states of electrons at the source and unoccupied states in the drain.

According to another embodiment of the present invention, a plurality of rows of quantum dots are connected in parallel between a common source and common drain. Furthermore, gate bodies associated with each quantum dot of a particular quantum dot row are also coupled in parallel with a particular quantum dot of every other parallel connected quantum dot row. In this embodiment, a myriad of digital logic functions can be created in a single quantum effect device.

An important technical advantage of the quantum effect logic device of the present invention inheres in the fact that vertical heterojunction barriers are used to bound the quantum dots. Thus, the size of the quantum dots may be precisely controlled, thereby providing for uniformity of operation of multiple quantum dots within the same epitaxial structure.

Another important technical advantage of the present invention is that vertical heterojunction barriers allow for serially connected quantum dots, thus allowing for the realization of digital electronic functions by application of potentials to gate bodies.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b is an energy band diagram illustrating quantum states within the three quantum dots of the logic unit shown in FIG. 1a;

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1A:
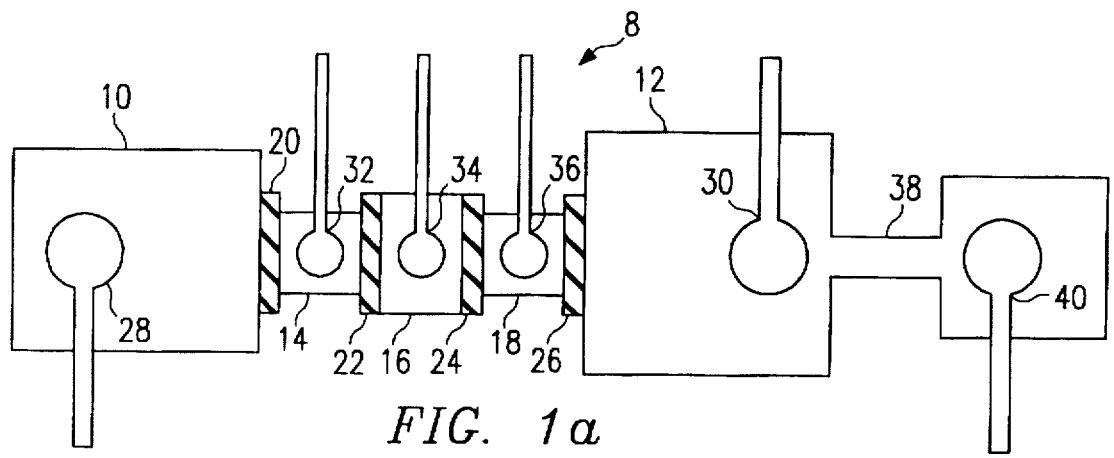
FIG. 1a is a highly magnified schematic plan view of a three-dot quantum dot logic unit.
Figure 1B:
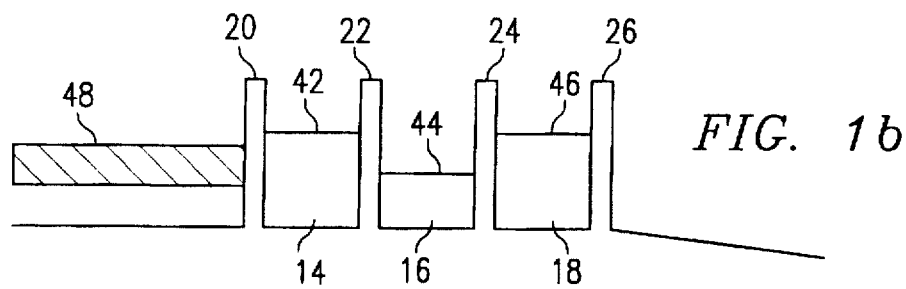

FIG. 1a is a schematic plan view of a three-input quantum dot logic unit 8 constructed according to the teachings of the present invention. Logic unit 8 comprises a source 10 and drain 12, separated by quantum dots 14, 16, and 18. Heterojunction tunneling barriers 20, 22, 24, and 26 separate quantum dots 14, 16, and 18 from each other and from source 10 and drain 12. A source contact 28 is ohmically contacted to source 10 to allow for application of electric potentials. Likewise, a drain contact 30 is ohmically contacted to drain 12 so as to allow for electrical connection to drain 12. Gate contacts 32, 34, and 36 are contacted above quantum wells 14, 16, and 18 to allow electric fields to be generated through quantum wells 14, 16, and 18. Gate contacts may also be disposed above the heterjunction tunneling barriers rather than directly above the quantum dots (this alternative is not shown in the FIGUREs). Drain 12 may be connected through load resistor 38 to a power supply contact 40.

In operation, logic unit 8 is a three-input logic gate. Current between source 10 and drain 12 can be switched "ON" or "OFF" by application of appropriate potentials on the order of 0–5 volts to gate contacts 32, 34, and 36. When logic unit 8 is "OFF", no current will flow between source 10 and drain 12. The voltage from drain 12 will therefore be the same as that of the voltage on power supply contact 40, which may be on the order of 0–5 volts, since there is no current flowing, and hence no voltage drop across load resistor 38. The voltage of drain 12 may be read through drain contact 30. If logic unit 8 is "ON", current will flow between drain 12 and source 10. Consequently, current will flow from power supply contact 40 through load resistor 38 through drain 12 and to source 10. If source 10 is connected to ground through source contact 28, and power supply 40 is connected to some voltage, for example five volts, then current will flow through load resistor 38 and to ground through source contact 28. Thus, the voltage at drain 12 will be close to ground. As can be seen, drain contact 30 may be used as an output for logic unit 8.

To switch logic unit 8 "ON" or "OFF", appropriate voltages must be applied to gate contacts 32, 34, and 36. As is shown in the energy band diagram of FIG. 1b, certain quantum states exist within quantum dots 14, 16, and 18. As is known by those skilled in the art, electrons will tunnel through heterojunction tunnel barriers 20, 22, 24, and 26, and quantum dots 14, 16, and 18 if the quantum states within those quantum dots are aligned with occupied energy states of electrons available at source 10 and unoccupied states in drain 12.

The quantum states within quantum dots 14, 16, and 18 are dependent upon the size of the quantum wells as are the electric fields within those wells. Because gate contacts 32, 34, and 36 are disposed above quantum wells 14, 16, and 18, potentials applied on those gate contacts will generate electric fields within, and individually within, the quantum dots. This is equally true if the gate contacts are disposed above the heterojunction barriers rather than the quantum dots. Thus, by applying appropriate potentials to gate contacts 32, 34, and 36, on the order of 0–5 volts, the quantum states within quantum wells 14, 16, and 18 can be aligned so as to allow tunneling between source 10 and drain 12, or misaligned so as to prevent tunneling of electrons between source 10 and drain 12.

Quantum dots 14, 16, and 18 may be of different sizes, so that different electric fields within the different sized dots will be required to align the quantum states. As shown in FIG. 1a, for example, the size of the quantum dots may be changed in the direction perpendicular to the direction of electron tunneling to allow for different intrinsic quantum states within the quantum dots. Consequently, different potentials will be required on the gate contacts of different sized dots to align or misalign the quantum states. Furthermore, the dots may be fabricated of different semiconductor materials for different intrinsic quantum states.

It will be understood by one skilled in the art that the number of quantum dots illustrated in quantum unit 8 is merely illustrative. An n-input logic unit may be created simply by fabricating n dots "serially" in the logic unit. Thus, logic units with more or less quantum dots than those illustrated in FIG. 1a are within the teachings of the present invention. For example, a logic unit with only one quantum dot may be constructed to provide a switching transistor.

Figure 2A:
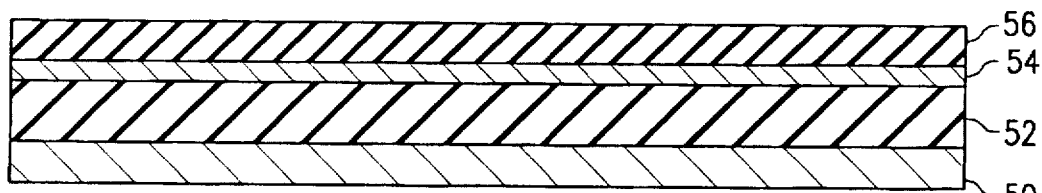
FIGS. 2a–2e are schematic cross-sectional views showing successive steps of fabricating a quantum effect logic unit according to the invention.

FIGS. 2a, 2b, 2c, 2d, and 2e are schematic cross-sectional views illustrating steps in fabricating logic unit 8. Referring to FIG. 2a, barrier layer 52 is shown overlying substrate 50. Substrate 50 may comprise, for example, semi-insulating indium phosphide. Other materials may be used without departing from the teachings of the present invention. For example, substrate 50 may be formed of semi-insulating gallium arsenide. The logic unit may be epitaxially grown in successive layers in a reactor such as a Riber 2300 MBE.

Because barrier layer 52 is grown on substrate 50, barrier layer 52 should be formed of a semiconductor material lattice-matched to substrate 50. For example, barrier layer 52 may be formed of indium aluminum arsenide for a substrate of indium phosphide, or of aluminum gallium arsenide for a substrate of gallium arsenide, and may be grown to a thickness on the order of 100 nm. Quantum layer 54 is grown over barrier layer 52 and is formed of a semiconductor material having a band gap lower than that of barrier layer 52. Quantum layer 54 may be formed of, for example, indium gallium arsenide or gallium arsenide. Quantum layer 54 may be grown using epitaxial crystal growth technology such as molecular beam epitaxy or organometallic chemical vapor deposition. Barrier layer 56 is grown over quantum layer 54. Barrier layer 56 is formed of a semiconductor material having a band gap higher than that of quantum layer 54. Barrier layer 56 may be formed of, for example, indium aluminum arsenide or aluminum gallium arsenide.

Figure 2B:
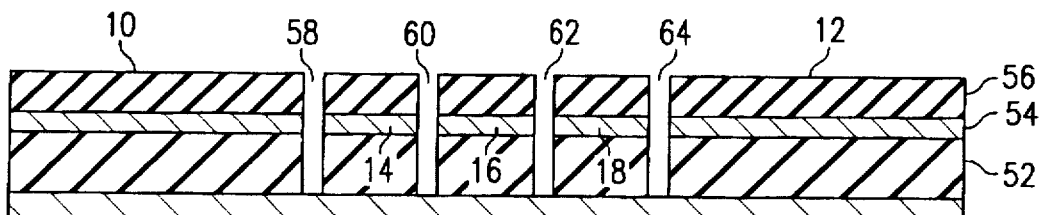
Figure 2C:
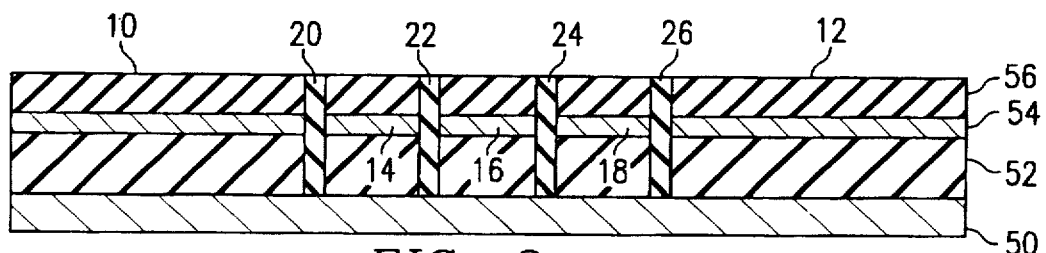

Referring now to FIG. 2b, a schematic representation of the semiconductor layers described in FIG. 1a is shown after trenches 58, 60, 62, and 64 have been etched from the face of barrier layer 56 through barrier layer 52. The trenches may be formed by laying down a resist mask using electron beam lithography and then etching from the face through to substrate 50. Etches such as selective chemical etches or reactive ion etches, for example, can be used to form trenches 58–64. As can be seen from FIG. 2b, quantum dots 14, 16, and 18, are formed in quantum layer 54 between trenches 58, 60, 62, and 64. Furthermore, source 10 and drain 12 are formed adjacent to trench 58 and 64, respectively. Semiconductor material with a high (wide) band gap energy in relation to that of quantum layer 54 is regrown in trenches 58, 60, 62, and 64. These regrown heterostructures form heterojunction tunneling barriers 20, 22, 24, and 26, as shown in FIG. 2c.

Heterojunction barriers 20, 22, 24, and 26, may be regrown in trenches 58 through 64 by a process such as organometallic vapor phase epitaxy as demonstrated in "Buried Rectangular GaInAs/InP Corrugations of 70 nm Pitch Fabricated by OMVPE," Electronics Letters 21st, June 1990, Vol. 26, No. 13, pp. 875–876, by Yamamoto, et al. With such a process, dots and barriers can each be grown on the order of 35 nm in width. Heterostructures having 10 nm features may also be formed as discussed by Notomi, Iwamura, Okamota, Nishida, and Tamamura in their paper entitled "InGaAs/InP Quantum Well Wires Fabricated By GSMBE, MOCVD, and Selective Chemical Etching Techniques", Journal of Crystal Growth, Vol. 105, p. 254–259 (1990). Heterojunction barriers 20 through 26 may also be regrown using molecular beam epitaxy or atomic layer epitaxy. Semiconductor materials such as indium phosphide or aluminum gallium arsenide may be used to form heterojunction tunneling barriers 20 through 26.

Use of heterojunction barriers allows for precise sizing of quantum dots, since the quantum dots are physically bounded. This precise sizing allows for reproduction of nearly identical devices, thus providing uniform operation and control of multiple devices. In contrast, prior art devices, such as those that make use of depletion-region barriers, have shown difficulty in creating uniform and reproducible performance from device to device, because of difficulties of reproducing identical devices.

Figure 2D:
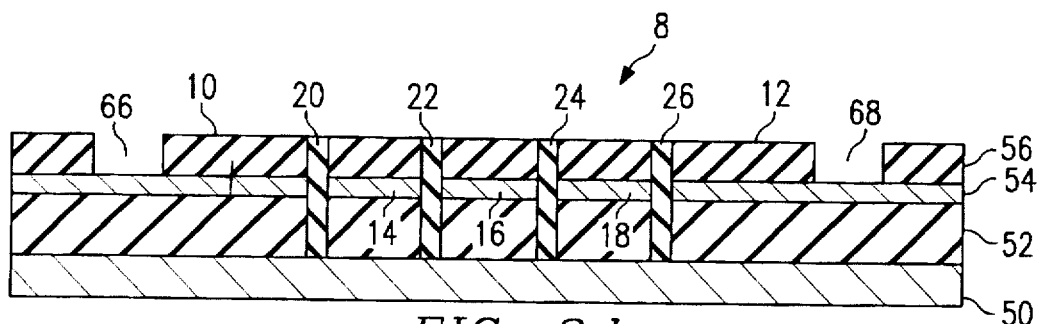
Figure 2E:
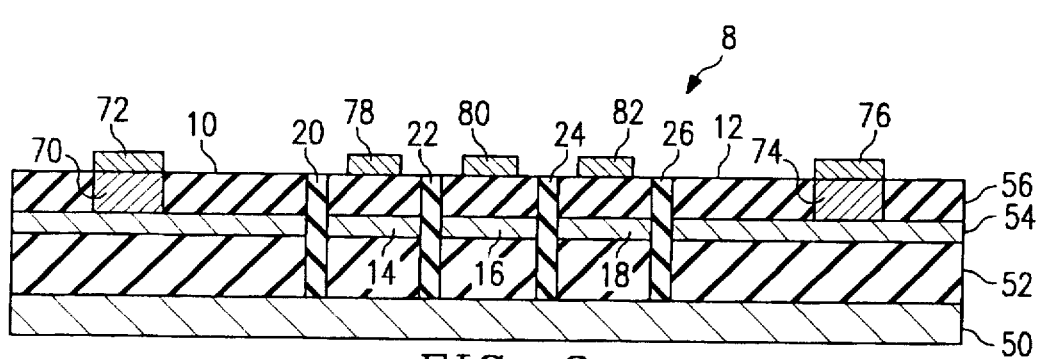

FIGS. 2d and 2e illustrate the final steps in fabricating logic unit 8. In FIG. 2d, trenches 66 and 68 are etched through barrier layer 56 and down to quantum layer 54. In trenches 66 and 68, contacts 70 and 74 are formed, as shown in FIG. 2e, and may comprise, for example, ohmic or alloyed ohmic contacts. Source contact 72 and drain contact 76 are then formed on ohmic contacts 70 and 72, respectively. Gate contacts 78, 80, and 82 are formed on the face of barrier layer 56 over quantum wells 14, 16, and 18, as shown in FIG. 2e. Contacts 72, 76, 78, 80, and 82 may be formed of a conducting material, such as aluminum. The reference to specific materials in the proceeding discussion has been merely illustrative, and other semiconductor and conducting materials may be used without departing from the teachings of the present invention.

Figure 3:
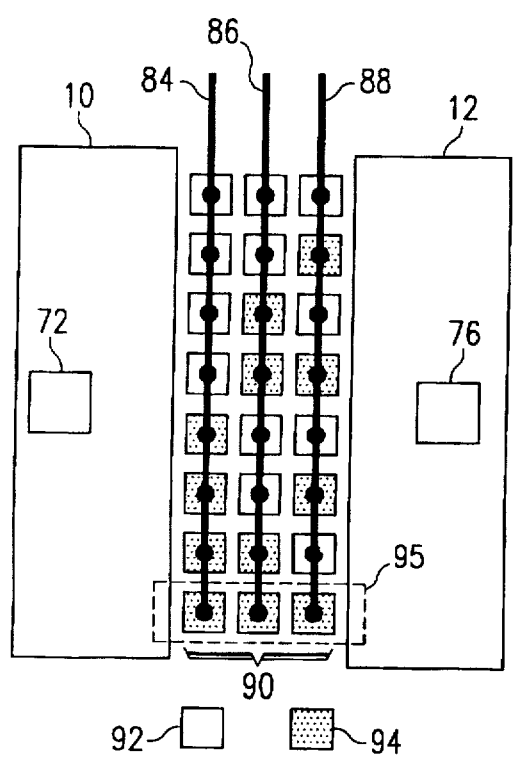
FIG. 3 is a plan view of an eight-unit, three-input universal quantum dot logic cell according to the present invention.

FIG. 3 is a schematic top view of a three-input quantum dot logic cell according to the present invention. In general terms, logic cell 83 comprises eight three-input logic units such as that depicted in FIG. 1, connected in parallel such that all eight units share a common source 10 and a common drain 12, and common inputs 84, 86, and 88. The quantum dots of each of the parallel connected logic units are shown generally as array 90.

Each dot in array 90 is either a "0" dot 92 or a "1" dot 94, as shown by the key at the bottom of FIG. 3. For a "0" dot, the quantum states within the dot will be aligned with available electron states at source 10 upon application of a logic "0" potential to that dot's gate contact. By the same token, application of a logic potential "1" to that dot's gate contact will misalign that dot's quantum state with the occupied energy states of electrons available at source 10. For a logic "1" dot, the quantum states within that dot will be aligned with available electron energy states at source 10 upon application of a logic "1" potential to that dot's gate contact. Conversely, application of a logic "0" potential to a logic "1" dot's gate contact will misalign that dot's quantum state with the available electron energy states at source 10. Logic "0" and logic "1" dots may be created by making the dots different sizes. As discussed above, different sized dots have different intrinsic quantum states.

Logic cell 83 represents a three-input logic cell. An n-input logic cell may be produced without departing from the teachings of the present invention. The following discussion is merely for the purpose of teaching the present invention, and illustrates the operation and logic associated with a three-input logic cell such as that shown in FIG. 3. With three digital inputs, eight different digital combinations may be presented. Referring to inputs 84, 86, and 88 as inputs "A", "B", and "C", the following table shows the eight possible combinations associated with the three inputs "A", "B", and "C".

| A | B | C |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

The quantum dots in array 90 are formed with either "0" dots or "1" dots. If the quantum states in all three of the quantum dots of any of the parallel logic units making up array 90 are aligned with the occupied energy states of electrons at source 10, electrons will flow between source 10 and drain 12. With a drain connected as described in connection with FIG. 1a, current flow because of electron tunneling between source 10 and drain 12 will result in a logic "0" appearing at drain 12.

In FIG. 3, the quantum dots of each of the logic units making up array 90 represent all of the possible combinations of digital inputs at inputs 84, 86, and 88. Thus, no matter what the logic state of any of the three inputs, electrons will tunnel between source 10 and drain 12. For example, if inputs 84, 86, and 88 are all at logic level "1", electrons will tunnel through the bottommost logic unit of array 90, logic unit 95, since logic unit 95 is comprised of three logic "1" dots. As can be seen, with inputs 84, 86, and 88 all at logic level and "1", electrons will not tunnel through any of the logic units making up array 90 except for logic unit 95, since none of the other logic units contain three logic "1" dots.

For logic cell 83, the material separating each of the logical units comprising array 90 will be the same material and regrown in separate trenches at the same time as the tunnel barriers described in connection with FIG. 2b and 2c. The separator trenches are formed at the same time as trenches 58, 60, 62, and 64. The spacing between each logic unit is chosen to be wide enough to prevent tunneling from logic unit to logic unit. Finally, the gate contacts over the appropriate dots of array 90 are connected in parallel using a metallic connection, such as aluminum.

Figure 4:
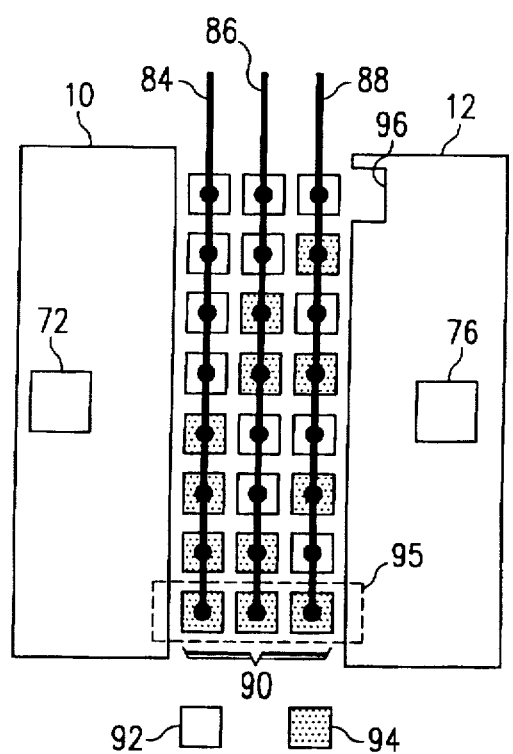
FIG. 4 is a plan view of a eight-unit, three-input quantum dot NOR gate, according to the present invention.

From a digital electronics standpoint, logic cell 83 as shown in FIG. 3 will produce a logic "0" output for any logical input on inputs 84, 86, and 88. In practical applications, what is desired is a logic cell that produces different logical outputs for different logical inputs. Thus, FIG. 4 illustrates the mechanism by which logic cell 83 may be programmed to provide specific logical outputs depending given logical inputs. By changing the shape of drain 12, specific logical functions can be realized.

As shown in FIG. 3, drain 12 has been fabricated so as to have a notch 96. Notch 96 could be etched and regrown just as the heterojunction tunneling barriers 20, 22, 24, 26 of FIG. 2e. Alternatively, notch 96 could simply be etched after all other processing steps are completed. This latter technique would allow custom circuits to be formed from prefabricated arrays. Because notch 96 is too wide to allow tunneling, three logical "0" inputs on inputs 84, 86, and 88 (which inputs, as discussed in relation to FIG. 3, would normally allow tunneling through the uppermost logic unit) will not result in tunneling between source 10 and drain 12. For a drain connection as described in conjunction with FIG. 1a, a logical "1" will appear at drain 12 and drain contact 96 for inputs of "0" on inputs 84, 86, and 88. Thus, FIG. 4 represents a three-input NOR gate.

The maximum number of parallel logic units that would be required to perform any Boolean logic function for an n-input logic cell $2^n$. However, many logic functions will not require that maximum number. For example, a three input NAND gate would require only one 3-dot logic unit, comprising three logic "1" dots. With source and drain connections as in FIG. 1a, a logic "0" would be output only for three logic "1" inputs.

Forming logic gates through use of a notch such as notch 96 is advantageous since any Boolean logic function can be "programmed" by etching notches into arrays of logic units. Moreover, forming logic gates in this manner ensures consistent output voltages, since either one or no logic units will be "on" at any one time.

In accordance with the teachings of the present invention, a digital electronic logic cell may be created by connecting in parallel a plurality of logic units. Each logic unit comprises serially connected quantum dots separated by vertical heterojunction tunneling barriers. Application of particular logical voltage potentials to gate contacts affect the quantum states of appropriate quantum dots of each parallel connected logic unit. By preventing tunneling of electrons through particular logic units, logic cells according to the present invention may be created to provide a myriad of logic functions.

Although the present invention and its advantages have been described in detail, it should be understood that various changes, substitutions and alterations can be made herein without departing from the spirit and scope of the invention as defined by the appended claims.

What is claimed is:

1. A quantum-effect logic device, comprising:
   a plurality of quantum dot rows in parallel between a source and a drain, said rows with dots of differing quantum states;
   a plurality of gates with each of said gates coupled to a quantum dot in each of said rows, said gates operable to modulate quantum states within said quantum dots;
   whereby a set of potentials applied to said plurality of gates permits carrier tunneling from said source to said drain through none or one of said rows.

* * * * *